United States Patent
Schiller

(10) Patent No.: US 8,136,231 B2
(45) Date of Patent: Mar. 20, 2012

(54) POSITIONING DEVICE AND METHOD FOR TRANSFERRING ELECTRONIC COMPONENTS USING OPTICAL ALIGNMENT

(75) Inventor: Gerhard Schiller, Roding (DE)

(73) Assignee: Muehlbauer AG, Roding (DE)

( * ) Notice: Subject to any disclaimer, the term of this patent is extended or adjusted under 35 U.S.C. 154(b) by 1029 days.

(21) Appl. No.: 10/595,507

(22) PCT Filed: Oct. 18, 2004

(86) PCT No.: PCT/EP2004/011703
§ 371 (c)(1),
(2), (4) Date: Jul. 15, 2008

(87) PCT Pub. No.: WO2005/041274
PCT Pub. Date: May 6, 2005

(65) Prior Publication Data
US 2008/0267745 A1    Oct. 30, 2008

(30) Foreign Application Priority Data
Oct. 25, 2003   (DE) .................................. 103 49 847

(51) Int. Cl.
*B23P 21/00* (2006.01)
(52) U.S. Cl. ................. 29/720; 29/739; 29/740; 29/833
(58) Field of Classification Search .............. 29/729, 29/739, 740, 759, 833–834; 438/105–111, 438/125; 156/64; 382/151
See application file for complete search history.

(56) References Cited

U.S. PATENT DOCUMENTS

| | | | | |
|---|---|---|---|---|
| 4,667,402 A | * | 5/1987 | Wilde | 29/840 |
| 5,338,381 A | * | 8/1994 | Hidese | 156/64 |
| 5,342,460 A | * | 8/1994 | Hidese | 156/64 |
| 5,866,801 A | * | 2/1999 | Johnson et al. | 73/38 |

FOREIGN PATENT DOCUMENTS

| | | |
|---|---|---|
| DE | 19734317 A1 | 2/1999 |
| DE | 19840226 A1 | 3/2000 |
| DE | 10159976 A1 | 4/2003 |
| DE | 19738922 C2 | 11/2008 |
| EP | 0949662 A2 | 10/1999 |
| EP | 1357590 A2 | 4/2003 |

* cited by examiner

Primary Examiner — Minh Trinh
(74) Attorney, Agent, or Firm — John A. Miller; Miller IP Group, PLC

(57) ABSTRACT

A positioning apparatus for transferring at least one electronic component, in particular a chip, from a first flat support to at least one predetermined location on a second flat support which extends parallel to the first support, comprising an ejection device for removing the component from the first support by means of an ejection movement, wherein a camera device is provided for detecting position data of the predetermined location, of the component to be removed from the first support and optionally of the ejection device, which together with the camera device are arranged essentially on an imaginary common straight line. A positioning method is also described.

16 Claims, 3 Drawing Sheets

POSITIONING DEVICE AND METHOD FOR TRANSFERRING ELECTRONIC COMPONENTS USING OPTICAL ALIGNMENT

BACKGROUND OF THE INVENTION

1. Field of the Invention

The invention relates to a positioning apparatus and to a positioning method for transferring at least one electronic component, in particular a chip, from a first flat support to at least one predetermined location on a second flat support which extends parallel to the first support, comprising an ejection device for removing the component from the first support by means of an ejection movement.

2. Discussion of the Related Art

Usually, in order to produce smart labels, semiconductor chips are removed from a wafer held on a film which acts as first support by means of a removal device referred to as a flipper. In such flip-chip machines, the removed chip or dice is flipped by the flipper, that is to say is turned upside down, in order then to be transported by means of a pick-and-place system to a substrate which forms the second flat support and to be arranged thereon.

Since a relatively large distance (compared to the size of the chip) has to be covered between the site of removal from the film carrying the wafer and a predetermined location on the substrate, which comprises the bond contacts for bonding the chip to the substrate, a technically complicated flip-chip bonder machine is required in order to ensure precise positioning of the chip or dice on the substrate to be equipped therewith. Such machines have high manufacturing costs, increased maintenance requirements on account of their complicated design and a low throughput on account of the long transport paths for the flip-chips.

DE 197 34 317 A1 describes a bonder for bonding semiconductor chips to a predetermined location representing the bond position on a second support representing a substrate. In said device, firstly position data of the individual dice arranged within the expanded wafer are detected by means of a measuring device and stored. The expanded wafer representing the first support is then positioned with the chip to be removed above the predetermined location on the second support, which represents the position of the bond contacts of the chip to be bonded thereto. The back of the dice is then ejected by means of an ejection movement and thus detaches from the film by means of an ejection needle acting on the back of the dice from above. The dice is thus placed directly at the predetermined location on the substrate.

To this end, an operation of positioning the dice to be detached with respect to the predetermined location on the substrate takes place by means of the previously detected position data recorded by the measuring device. Since a displacement of the wafer and thus of the dice to be removed is necessary between detection of the positioning data by the measuring device and transfer of the dice from the wafer or film to the substrate, in order to be able to arrange the dice above the predetermined location on the substrate, there is a risk of intermediate displacement of the dice (the position data of which have already been detected) on the support film due to changing stresses in the support film. This means that precise positioning of the dice to be removed above the predetermined location on the substrate is no longer possible. This occurs in particular when using very small dice within very large wafers which are divided into a large number of dice, and when using very small bond contacts which are already arranged on the substrate in the predetermined location.

Moreover, in such transfer apparatuses, there is no direct detection of the position data of the bond contacts at the location at which the bonding process is to be carried out. Rather, indirect one-dimensional positioning of the bond contacts is carried out by means of drive rollers by positioning the strip-shaped substrate on which the bond contacts are arranged. Due to existing material tolerances and position errors, this results in positioning errors in respect of the positioning of the predetermined location.

Furthermore, the described apparatus does not have a positioning device for positioning the ejection device with respect to the position of the dice to be removed and the predetermined location. This may also be a possible source of error for insufficiently precise positioning of the predetermined location with respect to the dice to be removed and the ejection device, and thus for precise arrangement of the dice on the bond contacts.

SUMMARY OF THE INVENTION

Accordingly, the object of the present invention is to provide a positioning apparatus for transferring electronic components from a first support to a second support, which reliably ensures with high precision that the components are arranged at predetermined locations on the second support. The object of the invention is also to provide a positioning method for transferring the components from the first to the second support, which ensures with high precision that the components are arranged at predetermined locations on the second support.

One essential point of the invention is that, in a positioning apparatus for transferring at least one electronic component, in particular a chip, from a first flat support to at least one predetermined location on a second flat support which extends parallel to the first support, comprising an ejection device for removing the component from the first support by means of an ejection movement, a camera device is provided for detecting position data, wherein the camera device is arranged on an imaginary common straight line with the predetermined location on the second support, the component to be removed and the ejection device. In this way, the position data of the parts and devices arranged essentially on one axis, namely the ejection device, the chip to be detached and the predetermined location on the second support at which bond contacts are arranged for the chip to be bonded, can be detected at the site at which the actual bonding process takes place. This advantageously means that mutual alignment of the chip, the bond contacts and the ejection device can take place under the control of the camera device which detects the position data, directly at the site of the bonding process which is to be carried out. As a result, these three elements are positioned one above the other with high precision, and this also permits simple subsequent correction in the event of any deviations.

To this end, the first support, which may be a support film on which a wafer is arranged, is connected to a first positioning device and the second support, which may be designed as a strip-shaped substrate, is connected to a second positioning device, said positioning devices being designed for positioning the two supports with respect to the common straight line. The first and second positioning devices respectively carry out a displacement of the first and second flat support in the support planes thereof, wherein, according to one preferred embodiment a rotation movement about a rotation axis perpendicular to the support planes is additionally possible. Such a rotation movement is advantageously carried out with the first support in order to align the wafer and thus an individual chip to be removed from this wafer with respect to the substrate strip and the bond contacts arranged thereon. By contrast, the second positioning device, which is assigned to the substrate strip, advantageously has displacement devices for displacing the strip in the X-direction and preferably additionally in the Y-direction, which both lie within the support plane.

Accordingly, an additional positioning device which is optionally assigned to the ejection device can be displaced not just in the X-direction and Y-direction but also in the Z-direction, in order to carry out an ejection movement which acts from above on the back of the chip to be detached.

According to one preferred embodiment, the strip-shaped substrate is made of an optically transparent material or of a partially perforated material, in order thus to allow the camera device to make optical contact from below with the chip to be removed and the ejection device. During a subsequent displacement of the strip-shaped substrate, the position data of the bond contacts are additionally detected by means of the camera device and alignment of the three elements with respect to one another is carried out by means of an evaluation device and a control device acting on the positioning devices. For this, account must be taken of the fact that further components which have already been applied prior to the transfer of the chip, such as antenna loops for example, are arranged on the strip-shaped substrate and interrupt the optically transparent region of the substrate.

According to one preferred embodiment, a flat support element, preferably made of optically transparent material, for supporting part of the strip-shaped substrate is arranged between the camera device and the strip-shaped substrate arranged thereabove. By using a transparent material, the camera device arranged therebelow can continue to make optical contact with the bond contacts arranged thereabove, the chip to be removed and the ejection device, in order to detect the position data thereof. The support surface can preferably be heated, in order to accelerate and improve the bonding process by the effect of heat. The support element may be designed in such a way that it can be moved, in particular displaced, upwards and downwards in the Z-direction.

A positioning method for transferring the electronic component from the first flat support to the predetermined location on the second flat support which extends parallel to the first support advantageously comprises the following steps:

displacing the second flat support along its support plane below the first flat support;

detecting position data of the chip arranged on the first support by means of the camera device arranged below the second support consisting of a material which is optically transparent at least in some regions, during displacement of the second support;

positioning a predetermined location on the second support above the camera device;

detecting position data of the predetermined location by means of the camera device; and aligning the first support, optionally the ejection device and/or the second support by means of positioning devices connected thereto, by displacement and/or rotation thereof with respect to one another within the support planes. Here, the camera device together with the predetermined location on the second support, the chip to be removed which is arranged on the first support and the ejection device are arranged on an imaginary common straight line.

In this way, the position data of the chip which is to be bonded and which has not yet been detached is advantageous detected at the same time as the strip-shaped substrate is transported, as a result of which not Only is there a considerable saving in terms of time and thus a higher throughput of a bonding machine, but also there is no need for an additional measuring device for determining the position of a chip on the wafer, as has been used to date.

According to one preferred embodiment, for the method according to the invention, the second support which is designed as a strip-shaped substrate is moved in its support plane at a displacement speed which is calculated from the distance between the chips to be removed successively from the first support, a displacement speed of the first support and position data of an optically transparent region of the second support, through which the camera device detects position data during displacement of the second support. The use of so-called wafer map files, which are provided by wafer manufacturers, is thus possible in such a way that the position information data thereof which relates to each functioning dice within a wafer can be used as distance data, and this can be used to calculate the size of the required time window for detecting the position of the dice and thus also the maximum transport speed of the substrate. By virtue of such a dynamic adaptation of the displacement speed of the substrate, a trouble-free process is achieved with maximum possible throughput of the machine.

Further embodiments emerge from the dependent claims.

BRIEF DESCRIPTION OF THE DRAWINGS

Advantages and expedient features can be found in the following description which is given in conjunction with the drawing, in which.

DETAILED DESCRIPTION OF THE EMBODIMENTS

Figure 1:
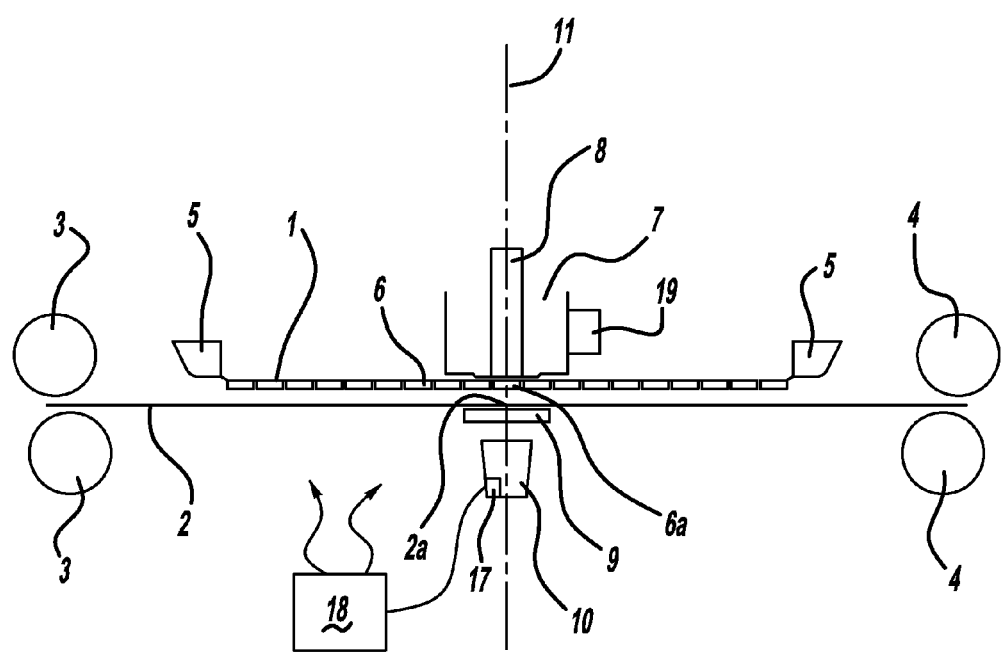
FIG. 1 shows a schematic cross-sectional diagram of the positioning apparatus according to the invention according to one embodiment of the invention.

FIG. 1 shows a schematic cross-sectional diagram of a positioning apparatus according to one embodiment of the invention. A wafer 1 arranged on a support film is arranged above and parallel to a strip-shaped substrate 2 which can be displaced by means of drive rollers 3, 4 from left to right and vice versa and also preferably additionally into the plane of the drawing and vice versa. By means of a wafer holder 5, the wafer 1 can be displaced within the wafer plane, that is to say in the X- and Y-direction, and can additionally be rotated about a rotation axis perpendicular to the wafer plane. This makes it possible for a chip 6a, which has been selected from a plurality of chips 6 and which is to be detached from the support film, to be aligned with a predetermined location on the substrate 2 which, as the bond position 2a, comprises bond contacts.

An ejection device 7 comprises an ejection needle 8 which, by means of an ejection movement in the Z-direction, that is to say a downward movement, acts on the back of the chip 6a to be detached and detaches it from the support film. In this way, the detached chip 6a is placed at the bond position 2a and is bonded to the bond contacts at this location. To this end, the apparatus has a flat support element 9 which can be heated to assist the bonding process.

Both the support element 9 and the substrate material of the substrate 2 are optically transparent, in order to allow a camera device 10, which is arranged below the support element 9, to make optical contact both with the chip 6a to be detached and the ejection device 7 and also with the bond position 2a. To this end, the substrate material may consist of a polymer-based plastic, such as PE, PET, PV or polyamide for example.

The substrate material is additionally provided with antenna coils by means of photochemical processes or a printing process for example, said antenna coils being connected to the chip that is to be bonded via the bond contacts which are also already arranged on the substrate material.

As can clearly be seen from FIG. 1, the camera device 10, the bond position 2a, the chip 6a to be detached and the ejection device 7 are arranged with their centre axes on an imaginary common straight line 11, which permits alignment of these elements with high precision.

Figure 2:
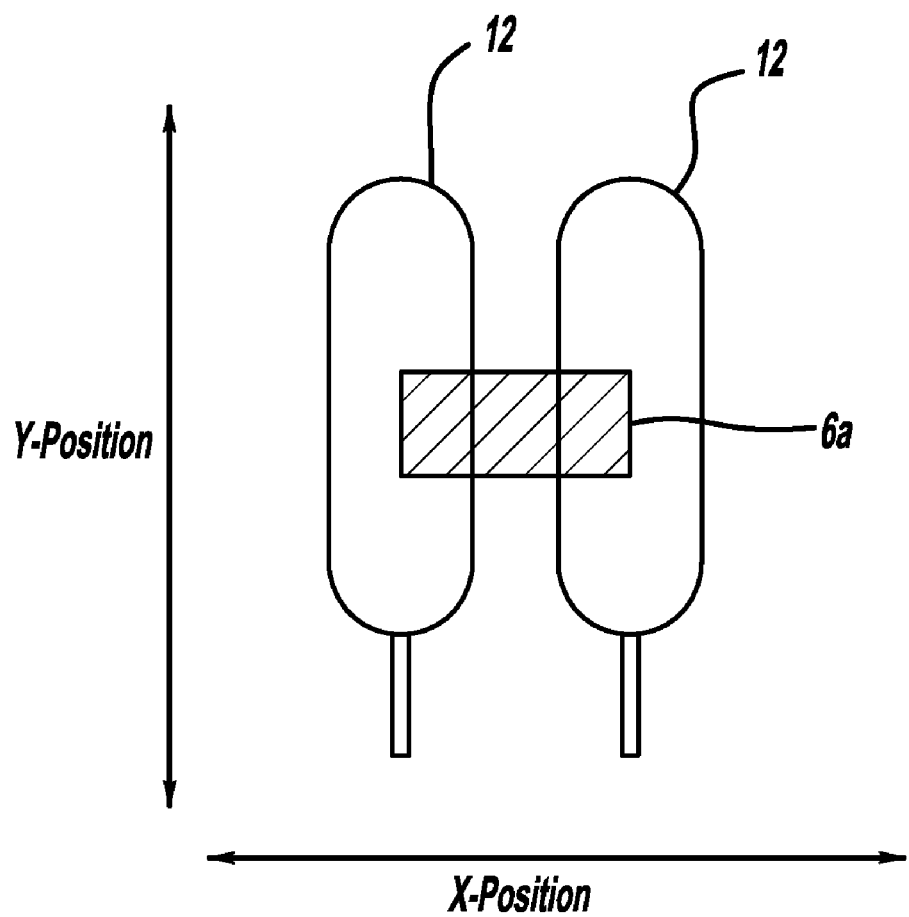
FIG. 2 shows a plan view of a predetermined location with bond contacts for use within the positioning apparatus according to the invention.

FIG. 2 shows, in a plan view, one possible form of the predetermined location 2a as can be used in the positioning apparatus according to a further embodiment in which the ejection device is unable to be positioned. Such a bond position 2a consists essentially of two bond contact connections 12, which in this illustrated layout have the advantage that there is no need for a positioning device for the ejection device 7 since the Surface areas of the bond contact connections 12 are relatively large compared to the size of the chip 6a to be bonded. This relates in particular to the longitudinal dimension of the bond contact connections 12 in the Y-direction.

For this, the ejection device 7 is positioned in a stationary manner with respect to the centre point of the camera device 10. The position of the chip 6a is determined during a transport movement of the substrate 2. By means of the determined position data, the chip is aligned with the zero point of the camera device, that is to say with the straight line 11, by means of the positioning device for the wafer holder 5. Once a transport movement of the substrate has taken place, the position data of the bond contacts 12 are detected by means of the camera device. The substrate is then displaced in the X-direction by the drive rollers 3, 4 in such a way that the bond contacts 12 are aligned precisely below the chip to be bonded. A movement of the ejection device then takes place in the Z-direction, in order to detach the chip from the support film and arrange it on the bond contacts.

An evaluation device 17, integrated with the camera device 10, determines and compares the positions of the chip 6a and the bond contacts 12. A control device 18, in communication with the evaluation device 17 and the positioning devices, controls movement of the wafer 1, the substrate strip 2 and optionally the ejection device 7 to achieve the desired alignment. An ejection device positioner 19 may be used to position the ejection device 7, although this is not required in some embodiments, as discussed above.

Figure 3:
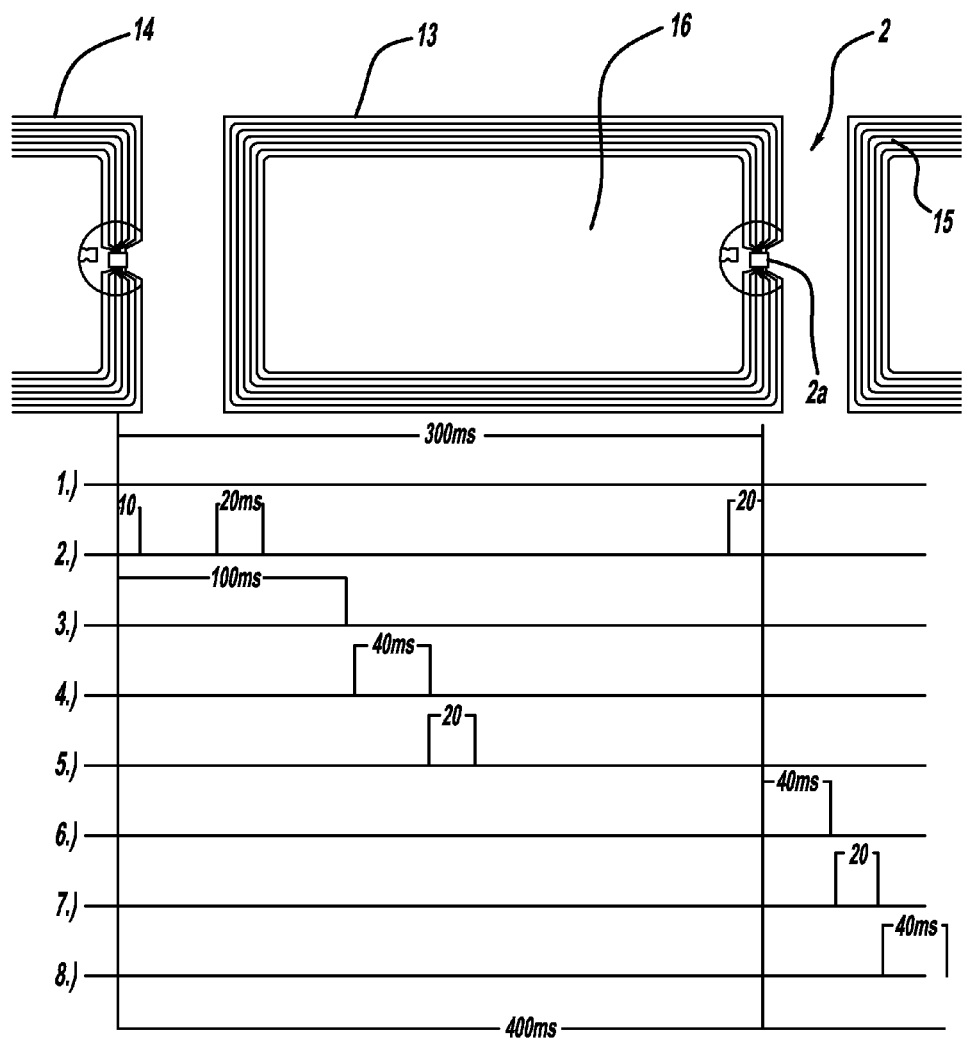
FIG. 3 shows a schematic diagram of the temporal course of the method according to one embodiment of the positioning method according to the invention, in conjunction with a plan view of part of a second support.

FIG. 3 shows a schematic diagram of one possible embodiment of the positioning method according to the invention. Also shown is a plan view of one possible arrangement of antenna loops 13, 14 and 15 on an optically transparent substrate 2 with optically transparent regions 16 located therebetween and therein.

The temporal course of one possible embodiment of the positioning method according to the invention, which is shown in the form of 8 different time signals, extends over a total time period of 400 Ms and shows inter alia the process of a displacement movement of the substrate during the detection of the position data of the chip and of the ejection device.

1.) shows the time period of 300 ms for a displacement movement of the substrate 2 from one bond position 2a to the next. 2.) shows those time periods in which the antennas 13, 14 and 12 do not allow the camera device to make optical contact with the chip.

3.) shows the time required to displace the wafer with respect to the camera device in such a way that the next chip with its position data can be detected. Detection of the position data then takes place within the time period of 40 ms shown at 4.). Any subsequent correction displacement of the chip which has to be carried out takes 20 ms, as shown at 5.).

Detection of the position data of the bond contact connections then takes place as shown at 6.), followed by any necessary correction displacement of the strip-shaped substrate or of the chip, as shown at 7.). In this way, the bond contact connections and the chip to be bonded and optionally the ejection device are mutually aligned on a common straight line.

The actual bonding process for bonding the chip to the bond contact connections takes place over a time period of 40 ms as shown at 8.).

All of the features disclosed in the application documents are regarded as being essential to the invention both individually and in combination. The person skilled in the art will be familiar with modifications thereto.

LIST OF REFERENCES 1 wafer
2 substrate strip
2a bond position
3, 4 drive rollers
5 wafer holder
6 chips
6a chip to be detached
7 ejection device
8 ejection needle
9 support
10 camera device
11 straight line
12 bond contact connections
13, 14, 15 antennas
16 optically transparent region
17 evaluation device
18 control device
19 ejection device positioner

What is claimed is:

1. A positioning apparatus for transferring at least one electronic component, comprising:
  a first flat support;
  a second flat support which extends parallel to the first flat support,
  wherein the apparatus is configured for transferring at least one electronic component from the first flat support to at least one predetermined bond location on the second flat support,
  a flat support element of the apparatus, positioned to provide structural support for the second flat support,
  a camera device configured for detecting position data of the at least one predetermined bond location and of the at least one electronic components to be removed from the first flat support; and
  an ejection device for removing the at least one electronic component from the first flat support by an ejection movement, wherein the camera device, the flat support element of the apparatus, the second flat support, the first flat support, and the ejection device, in this order, are arranged along a common straight line, and wherein the flat support element of the apparatus is optically transparent, and wherein at least a portion of the second flat support is optically transparent to allow the camera device to make optical contact with both the at least one electronic component to be removed and the at least one predetermined bond location.

2. The apparatus according to claim 1, wherein the first flat support is connected to a first positioning device for positioning the first flat support relative to the common straight line, wherein the second flat support is connected to a second positioning device for positioning the second flat support relative to the common straight line, and wherein the second flat support is moved in its support plane at a displacement speed which is calculated from:

a distance between a plurality of electronic components to be successively removed from the first flat support;

a displacement speed of the first flat support; and position data of the optically transparent portion of the second flat support through which the camera device detects position data during displacement of the second flat support.

3. The apparatus according to claim 2, wherein the first and second positioning devices perform rotation of the first and second flat supports, respectively, about a rotation axis perpendicular to the support planes of the first and second flat supports.

4. The apparatus according to claim 3, further comprising:

a third positioning device connected to the ejection device for positioning the ejection device with respect to the common straight line by displacing the ejection device in a direction parallel to the first and second flat supports.

5. The apparatus according to claim 2, wherein the first and second positioning devices perform displacement of the first and second flat supports, respectively, in their respective support planes.

6. The apparatus according to claim 1, wherein the second flat support includes a strip-shaped substrate.

7. The apparatus according to claim 6, wherein the strip-shaped substrate includes an optically transparent material.

8. The apparatus according to claim 6, wherein the strip-shaped substrate includes a partially perforated material.

9. The apparatus according to claim 6, wherein the second flat support includes additional components when the at least one electronic component is transferred thereto.

10. The apparatus according to claim 9, wherein the strip-shaped substrate of the second flat support includes bond contacts for bonding the at least one electronic component at the predetermined bond location on the strip-shaped substrate.

11. The apparatus according to claim 1, wherein the second flat support comprises individual substrate elements, which are spaced apart from one another.

12. The apparatus according to claim 1, wherein the camera device is arranged below the second flat support along the common straight line, wherein the common straight line extends through the camera device in a vertical direction.

13. The apparatus according to claim 12, wherein the flat support element of the apparatus is arranged between the camera device and the second flat support for supporting the optically transparent portion of the second flat support.

14. The apparatus according to claim 13, wherein the flat support element of the apparatus is displaceable along the vertical axis.

15. The apparatus according to claim 1, wherein the camera device comprises an evaluation device for evaluating and comparing the detected position data.

16. The apparatus according to claim 15, further comprising a control device for controlling the positioning devices based on a comparison of position data.

* * * * *